(12) United States Patent
Liu et al.

(10) Patent No.: US 8,331,072 B1
(45) Date of Patent: Dec. 11, 2012

(54) TIMER CONTROLLED, SHORT AND OPEN CIRCUIT FAULT DETECTION WITH SLEW-RATE BOOSTED OUTPUT DRIVER

(75) Inventors: Huibo Liu, San Jose, CA (US); David Castaneda, Morgan Hill, CA (US); Yuanfang Li, Irvine, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 215 days.

(21) Appl. No.: 12/868,652

(22) Filed: Aug. 25, 2010

(51) Int. Cl.
*H02H 9/02* (2006.01)
(52) U.S. Cl. ...................................... 361/93.9; 361/93.7
(58) Field of Classification Search ......... 361/93.7–93.9
See application file for complete search history.

(56) References Cited

U.S. PATENT DOCUMENTS 6,947,272 B2 * 9/2005 Daniels et al. ............... 361/93.9
8,213,147 B2 * 7/2012 Maher et al. ................. 361/93.1

* cited by examiner

*Primary Examiner* — Danny Nguyen

(57) ABSTRACT

A driver circuit uses a feedback loop having a programmable timer and timer logic to adjust a slew rate delay period used to accommodate slewing current when charging or discharging a load capacitor, and to increase the current limit during the slew rate delay period by selecting a larger input current reference value. Increasing the current limit provides for a faster settling time. The value of each input current reference value can be programmed. The programmable timer and the timer logic can be configured to coordinate the slew rate delay period and the selected input current reference value. The slew rate delay period can be adjusted based on which input current reference value is applied.

25 Claims, 3 Drawing Sheets

US 8,331,072 B1

TIMER CONTROLLED, SHORT AND OPEN CIRCUIT FAULT DETECTION WITH SLEW-RATE BOOSTED OUTPUT DRIVER

FIELD OF THE INVENTION

The present invention relates to the field of driver circuits. More particularly, the present invention relates to the field of driver circuits that have short and open circuit fault detection.

BACKGROUND OF THE INVENTION

Fault detection is included in circuits to detect error conditions occurring within the circuit. Typical error conditions include unintended short circuits and open circuits. In an exemplary circuit, an amplifier and driver output stage are used to provide drive signals to a remote load via a cable. If the cable becomes shorted to a power supply of the amplifier or to ground, an over-current condition results at the driver output stage. If the cable open circuits, such as a broken or severed cable, the controlled driver current can not be supplied to the load, which results in a driver stage output voltage approaching the supply voltage, in which case the controlling signal will be lost.

A conventional approach for implementing fault detection is to sense the high output current for short circuit conditions, and to sense the output voltage for open circuit conditions. FIG. 1 illustrates a schematic diagram of a conventional driver circuit having fault detection and current limiting functionality. The driver circuit is configured to deliver a driving signal (Vout) to a load, for example a remotely connected sensor. A differential voltage is input to a transconductance amplifier (gm amplifier) 2, which outputs a current proportional to the input voltage. The amplifier output is coupled to a driver circuit having a first transistor T1 coupled to a second transistor T2. In some embodiments, the transistor T1 and the transistor T2 are each metal-oxide-semiconductor field-effect transistors (MOSFETs). In the configuration shown in FIG. 1, the transistor T1 is a p-channel MOSFET, and the transistor T2 is a n-channel MOSFET. It is understood that other types and configurations of transistors can be used. A first output of the amplifier 2 is coupled to a gate of the first transistor T1. A second output of the amplifier 2 is coupled to a gate of the second transistor T2. A bias circuit 4 couples a supply voltage VDD to the first output of the amplifier 2 and to the gate of the transistor T1. A bias circuit 6 couples the second output of the amplifier 2 and the gate of the transistor T2 to ground. A load capacitor Cload is coupled to a drain of the transistor T1 and to a drain of the transistor T2. An output voltage Vout across the load capacitor Cload is used to drive a load.

Short circuit detection is built into the circuit of FIG. 1. A current limiting circuit limits the current through the output driver circuit when a short circuit condition is detected. The current limiting circuit is implemented as a feedback loop including the feedback circuit 8 and the sense resistor Rsense. The feedback circuit 8 measures a voltage Vs at the source of the transistor T1. The current Is through the transistor T1 is determined according to the measured voltage Vs and the known value of the sense resistor Rsense. The feedback circuit 8 compares the determined current Is to an input reference current value Iref. If the current Is reaches the reference current value Iref, then an over-current condition is determined to exist. In response to the over-current condition, the feedback circuit 8 outputs a control current to the gate of the transistor T1 that limits the current Is to a maximum current, such as the reference current value Iref. In other words, the feedback circuit 8 controls the current Is so as not to exceed some predetermined value.

Ideally, the current limiting circuit is designed to detect a short circuit condition at the output of the driver circuit, for example at Vout, and limit the current Is to some over-current value in response to the short circuit. The short circuit may be a short to ground or a short to the supply voltage VDD. Left unresolved, a short circuit results in increasing current Is until breakdown occurs. Determining the over-current condition as described above is intended as a means for identifying a short circuit at the driver circuit output. In addition to limiting the current Is, an over-current flag is output by the feedback circuit 8. However, even if there is not a short-circuit, certain conditions exist that lead to a false short circuit determination made by the feedback circuit 8, referred to as a false short. When a false short is determined, the feedback circuit 8 inappropriately limits the current Is and sends out an over-current flag.

One such condition results from the circuit's inability to differentiate between a real short circuit condition and a normal heavy slewing condition that occurs when charging the load capacitor Cload to the output voltage Vout. The slewing current that charges the load capacitor Cload may be determined as an over-current condition, which causes the slewing current to be limited to the short circuit limit current and an over-current flag to be generated. This problem is intensified with high capacitive loading, such as capacitive loading up to 100 uF, as a larger load capacitor generates a larger slewing current. By limiting the slewing current to the short circuit limit current, the settling time of the circuit is increased. As such, false shorts may result from normal slewing conditions, or the charging of a large load capacitor. The circuit can not differentiate whether the over-current condition is due to the normal slewing condition, the charging of a large load capacitor, or due to an actual short circuit.

Open circuit detection is also built into the circuit of FIG. 1. An open circuit condition may result in the driver circuit losing the control signal. During an open circuit condition, zero current Is flows, and there is no voltage drop across the resistor Rsense. As such, the sensed voltage Vs is the same as the supply voltage VDD. The feedback circuit 8 measures the sensed voltage Vs and if the sensed voltage Vs is equal to the signal voltage VDD, then an open circuit condition is determined and an open circuit error flag is generated. Alternatively, instead of determining if the sensed voltage Vs is equal to the supply voltage VDD, a reference threshold voltage Vthres can be input to the feedback circuit 8, and the sensed voltage Vs is compared to the threshold voltage Vthres. If the sensed voltage Vs is equal to or greater than the threshold voltage Vthres, then the open circuit error flag is generated.

In general, the fault detection circuit of FIG. 1 inappropriately determines certain short duration events as fault conditions. In particular, during the short duration event of charging the load capacitor, the slewing current is greater than the short circuit limit current and an over-current condition is determined. The fault detection circuit can not differentiate between the normal slewing current when the load capacitor is charging versus an actual short circuit condition. False open circuit conditions may result when the output Vout is dynamically switched to a voltage level that approaches the supply level VDD, which results in a longer time period to discharge the load capacitance to a controlled level. FIG. 2 illustrates a schematic diagram of another conventional driver circuit having fault detection and current limiting functionality. The circuit of FIG. 2 has the same input and driver stages as the circuit of FIG. 1. However, the feedback circuit loop of FIG.

2 has a timer to enable a time delay from the onset of the over-current condition to the actual limiting of the current and generation of the over-current error flag. The feedback circuit of FIG. 2 also enables a time delay from the onset of the open circuit condition to the generation of the open circuit error flag.

In particular, the feedback circuit loop includes current and voltage sensing circuits 10 configured to sense the current Is through the transistor T1 and the voltage Vs. As applied to the short circuit condition, the sensed current is input as an input to current and voltage comparators 12. Although shown in FIG. 2 as a single block, the current and voltage comparators block 12 is representative of all circuitry needed to perform current comparisons and voltage comparisons of various inputs. A reference current Isht is input as another input to the comparators 12. The reference current Isht is the short circuit limit current. The comparators 12 determines if the sensed current has reached the short circuit limit current. If the comparators 12 determine that the sensed current is less than the short circuit limit current, then the comparators 12 output a first signal. In some embodiments, the first signal is a "low" signal, such as zero volts. The first signal is input to a current amplifier 14, a preset timer 16, and a timer logic 18. The first signal indicates that an over-current condition has not been met, and that the current Is does not have to be limited. In response to the first signal, the current amplifier 14 outputs a "low" signal, such as zero amps, to the gate of the transistor T1. Also in response to the first signal, the preset timer 16 and the timer logic 18 are in an "off" state. If the comparators 12 determine that the sensed current is equal to or greater than the short circuit limit current, then the comparators 12 output a second signal. In some embodiments, the second signal is a "high" signal, such as some voltage greater than zero volts. The second signal indicates that an over-current condition exists. In response to the second signal, the current amplifier 14 outputs a "high" signal to the gate of the transistor T1. This high signal at the gate limits the current Is to the short circuit limit current. Also in response to the second signal, the preset timer 16 and the timer logic 18 are turned to an "on" state, which starts the clock on the preset timer 16. The clock continues to count until the comparators 12 determine that the sensed current has dropped below the reference current Isht, at which time the comparators 12 output the first signal, which turns off the preset timer and stops the count. The preset timer 16 is set with a count threshold. If the count on the preset timer 16 reaches the count threshold, a count exceeded signal is sent from the preset timer 16 to the timer logic 18. In response to the count exceeded signal, the timer logic 18 generates an over-current error flag. The circuit shown in FIG. 2 is a portion of the MAX15500 chip manufactured by Maxim Integrated Products®, which is hereby incorporated in its entirety by reference.

The preset timer and timer logic in the circuit of FIG. 2 provides for a time delay for issuing an over-current error flag. The time delay is used to account for a short duration event, such as charging the load capacitor Cload, which causes an increase in the current Is to the short circuit limit current for a short period of time. Although the circuit of FIG. 2 allows for such short duration events before issuing an over-current error flag, the current Is is still limited to the short circuit limit current during this time period.

Open circuit detection is also included in the circuit of FIG. 2. Similarly to the open circuit detection of FIG. 1, the sensing circuits 10 sense the voltage Vs, which is input to the comparators 12, along with a threshold voltage Vthres. If the comparators 12 determine that the sensed voltage Vs is less than the threshold voltage Vthres, then the comparators 12 output a third signal. In some embodiments, the third signal is a "low" signal, such as zero volts. The third signal is input to the preset timer 16 and the timer logic 18. The third signal indicates that an over-voltage condition has not been met, and that an open circuit error flag does not have to be generated. In response to the third signal, the preset timer 16 and the timer logic 18 are in an "off" state. If the comparators 12 determine that the sensed voltage Vs is equal to or greater than the short circuit limit current, then the comparators 12 output a fourth signal. In some embodiments, the fourth signal is a "high" signal, such as some voltage greater than zero volts. The fourth signal indicates that an over-voltage condition exists. In response to the fourth signal, the preset timer 16 and the timer logic 18 are turned to an "on" state, which starts the clock on the preset timer 16. The clock continues to count until the comparators 12 determine that the sensed current has dropped below the threshold voltage Vthres, at which time the comparators 12 output the third signal, which turns off the preset timer and stops the count. The preset timer 16 is set with a voltage count threshold. If the count on the preset timer 16 reaches the voltage count threshold, a voltage count exceeded signal is sent from the preset timer 16 to the timer logic 18. In response to the voltage count exceeded signal, the timer logic 18 generates an open circuit error flag.

In addition to inappropriately determining short circuit conditions, the fault detection circuit of FIG. 1 also inappropriately determines certain conditions as open circuit fault conditions, such as when the output voltage Vout is dynamically switched to a voltage level that approaches the supply voltage VDD, which results in a longer time period to discharge the load capacitor to a controlled level. This can result in a false open circuit error flag. Similarly to the over-current condition, the timer and timer logic in FIG. 2 can be used to delay generation of the open circuit error flag.

In addition to generating false error flags, the fault detection circuits of FIGS. 1 and 2 do not have the ability to boost the slewing current beyond the short circuit limit current. In particular, the slewing current is limited by the short circuit limit current when driving large capacitive loads. This results in slower settling time for the circuit. In some applications, loads coupled to the output capacitor Cload have response time requirements that would be adversely affected by a slower settling time. The settling time of a device is the time elapsed from the application of an ideal instantaneous step input to the time at which the device output enters and remains within a specified error band, usually symmetrical about the final value. Settling time includes a propagation delay plus the time required for the output to slew to the vicinity of the final value, recover from the overload condition associated with slew, and settle to within the specified error. Propagation delay, or gate delay, is the length of time starting from when the input to a logic gate becomes stable and valid, to the time that the output of that logic gate is stable and valid. Systems with energy storage elements cannot respond instantaneously and exhibit transient responses when subjected to inputs or disturbances.

In conventional configurations, due to power consumption requirements of the circuit, a short circuit current limit is set by the system, such as about 10 mA. The short circuit current limit is implemented to prevent over current when a short circuit occurs. In the case where the capacitive loading is about 100 uF and the short circuit current limit is about 10 mA, a slew rate of the load capacitor is limited to a maximum at 1V/10 mS.

SUMMARY OF THE INVENTION

Embodiments of a driver circuit includes a programmable timer and timer logic to adjust a slew rate delay period used to accommodate slewing current when charging or discharging a load capacitor, and to increase the current limit during the slew rate delay period by selecting a larger input current reference value. Increasing the current limit provides for a faster settling time. The value of each input current reference value can be programmed. The programmable timer and the timer logic can be configured to coordinate the slew rate delay period and the selected input current reference value. The slew rate delay period can be adjusted based on which input current reference value is applied. An open circuit condition can also be determined, and the programmable timer and timer logic can be further configured to delay the generation of an open circuit error flag in order to accommodate short duration events where the output voltage is the same, or in some embodiments close to, the supply voltage.

In one aspect, a circuit is disclosed that includes an output driver circuit having a driver current; a load capacitor coupled to the driver circuit to receive the driver current; and a feedback circuit coupled to the driver circuit, wherein the feedback circuit is configured to determine an over-current condition in the driver circuit and to limit the driver current to a limit current value upon determination of the over-current condition, further wherein the feedback circuit comprises a programmable timer and a timer logic configured to delay generation of an over-current error flag in response to the over-current condition according to a slew rate delay period, the programmable timer is configured to vary the slew rate delay period according to a loading condition applied to the load capacitor. The limit current is a slewing current of the load capacitor. The feedback circuit can also include a current comparator configured to receive the driver current as a first input and an input current reference value as a second input, the current comparator determines that the over-current condition is present if the driver current is equal to or greater than the input current reference value. The feedback circuit can also include a current sensing circuit configured to sense the driver current through the driver circuit and to output the sensed driver current to the first input of the current comparator. The feedback circuit can be further configured to determine an over-voltage condition in the driver circuit, and the programmable timer and the timer logic can be further configured to delay generation of an over-voltage error flag in response to the over-voltage condition.

In another aspect, a circuit is disclosed that includes an output driver circuit having a driver current; a load capacitor coupled to the driver circuit to receive the driver current; and a feedback circuit coupled to the driver circuit, wherein the feedback circuit is configured to determine an over-current condition in the driver circuit and to limit the driver current to a limit current value upon determination of the over-current condition, further wherein the feedback circuit comprises a logic circuit configured to select one of a plurality of input current reference values received by the feedback circuit, the selected input current reference value used to determine the over-current condition and the limit current value, thereby enabling adjustment of the limit current value during the over-current condition according to the selected input current reference value. The limit current is a slewing current of the load capacitor. The limit current value can be increased during the over-current condition, thereby decreasing a settling time of the circuit. The feedback circuit can also include a programmable timer, wherein the programmable timer and the logic circuit are configured to delay generation of an error flag in response to the over-current condition according to a slew rate delay period. The limit current can be increased during the slew rate delay period by selecting a larger input current reference value from the plurality of input current reference values. The slew rate delay period can be varied by the programmable timer according to a loading condition applied to the load capacitor. The selected input current reference value can be determined according to the slew rate delay period. The slew rate delay period can be varied by the programmable timer according to the selected input current reference value. The feedback circuit can also include a current comparator configured to receive the driver current as a first input and the selected input current reference value as a second input, the current comparator determines that the over-current condition is present if the driver current is equal to or greater than the selected input current reference value. The feedback circuit can also include a current sensing circuit configured to sense the driver current through the driver circuit and to output the sensed driver current to the first input of the current comparator. The feedback circuit can also include a switching circuit configured to receive the plurality of input current reference values as a plurality of inputs, to receive a selection signal as input from the logic circuit, and to output the selected input current reference value to the second input of the current comparator. Each of the plurality of input current reference values can be programmable. The feedback circuit can be further configured to determine an over-voltage condition in the driver circuit, and the programmable timer and the timer logic can be further configured to delay generation of an over-voltage error flag in response to the over-voltage condition.

In yet another aspect, a circuit is disclosed that includes an output driver circuit having a driver current; a load capacitor coupled to the driver circuit to receive the driver current; and a feedback circuit coupled to the driver circuit, wherein the feedback circuit is configured to determine an over-current condition in the driver circuit and to limit the driver current to a limit current value upon determination of the over-current condition. The feedback circuit includes a current sensing circuit configured to sense the driver current; a switching circuit configured to receive a plurality of input current reference values as a plurality of inputs, and to output a selected input current reference value from the plurality of input current reference values in response to a selection signal, wherein the selected input current reference value is used to determine the over-current condition and the limit current value, thereby enabling adjustment of the limit current value during the over-current condition according to the selected input current reference value; a current comparator coupled to the current sensing circuit to receive the sensed driver current as a first input and coupled to the switching circuit to receive the selected input current reference value as a second input, the current comparator outputs a comparison signal indicating that the over-current condition is present if the driver current is equal to or greater than the selected input current reference value; a programmable timer coupled to the current comparator; and a timer logic circuit configured to generate the selection signal and output the selection signal to the switching circuit, wherein the timer logic circuit and the programmable timer are configured to delay generation of an error flag in response to the over-current condition according to a slew rate delay period, the programmable timer is configured to vary the slew rate delay period according to a loading condition applied to the load capacitor. The limit current is a slewing current of the load capacitor. The limit current value can be increased during the over-current condition, thereby decreasing a settling time of the circuit. The limit current can be increased during the slew rate delay period by selecting a larger input current reference value from the plurality of input current reference values. The selected input current reference value can be determined according to the slew rate delay period. Each of the plurality of input current reference values can be programmable. The feedback circuit can be further configured to determine an over-voltage condition in the driver circuit, and the programmable timer and the timer logic can be further configured to delay generation of an over-voltage error flag in response to the over-voltage condition.

BRIEF DESCRIPTION OF THE DRAWINGS

Embodiments of the driver circuit are described relative to the several views of the drawings. Where appropriate and only where identical elements are disclosed and shown in more than one drawing, the same reference numeral will be used to represent such identical elements.

DETAILED DESCRIPTION OF THE EMBODIMENTS

Figure 1:
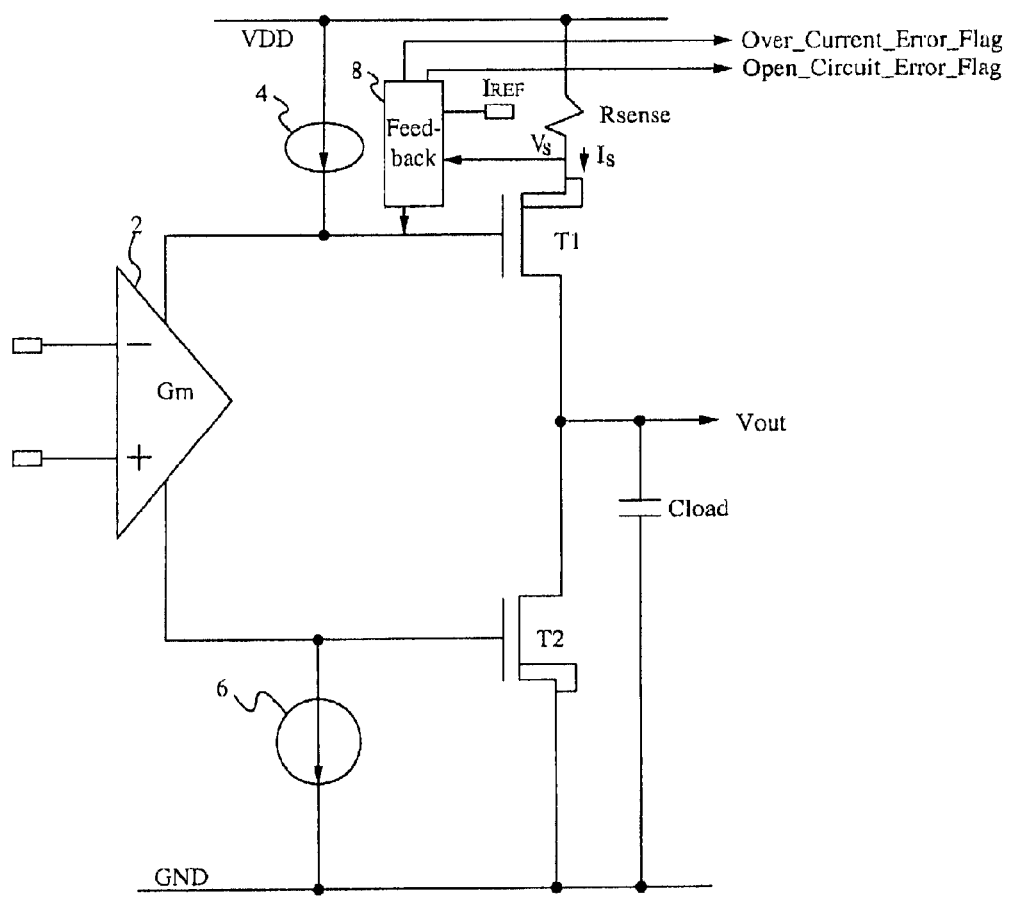
FIG. 1 illustrates a schematic diagram of a conventional driver circuit having fault detection and current limiting functionality.

Embodiments of the present application are directed to a driver circuit. Those of ordinary skill in the art will realize that the following detailed description of the driver circuit is illustrative only and is not intended to be in any way limiting. Other embodiments of the driver circuit will readily suggest themselves to such skilled persons having the benefit of this disclosure.

Reference will now be made in detail to implementations of the driver circuit as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Embodiments of a driver circuit includes a programmable timer and timer logic to adjust a slew rate delay period used to accommodate slewing current, or over-current, when charging or discharging a load capacitor. The slew rate delay period is based on the amount of time to charge or discharge the worst case capacitive loading given the output stage current driving capabilities. In some embodiments, the slew rate delay period is a predetermined value programmed into the programmable timer and/or the timer logic. The driver circuit is also configured to determine an over-voltage, or open circuit, condition in which case the programmable timer and timer logic are configured to delay the generation of an open circuit error flag. Once an over-current or over-voltage condition is detected, a signal is sent to trigger the programmable timer. In some embodiments, if the over-current or over-voltage condition lasts as long or longer than the slew rate delay period, then a fault detected interrupt signal is generated and transmitted by the timer logic. In other embodiments, the delay period for the over-voltage condition is set at a different value than the slew rate delay period. The driver circuit also includes selectable input current reference values for determining an over-current condition, which enables modification of a short circuit limit current. Using the timer logic, a slewing rate can be increased for a specified period of time by selecting a higher input current reference value, which increases the short circuit limit current to a higher level during that specified period of time. Increasing the short circuit limit current reduces the settling time of the circuit. The specified period of time is determined according to the power consumption requirement and the settling time requirement. In some embodiments, the specified period of time is determined as the time period starting from when the short circuit current is first increased to the when the output voltage Vout reaches a target voltage level, for example within 200 mV from the fully charged voltage level of the load capacitor Cload. In some embodiments, the timer logic is configured to adjust the slew rate delay period according to which input current reference value is selected. For example, if the input current reference value is a first value, then the slew rate delay period is a first period of time. If the input current reference value is a second value that is different than the first value, then the slew rate delay period can be the same first period of time or a second period of time that is different than the first period of time.

Figure 2:
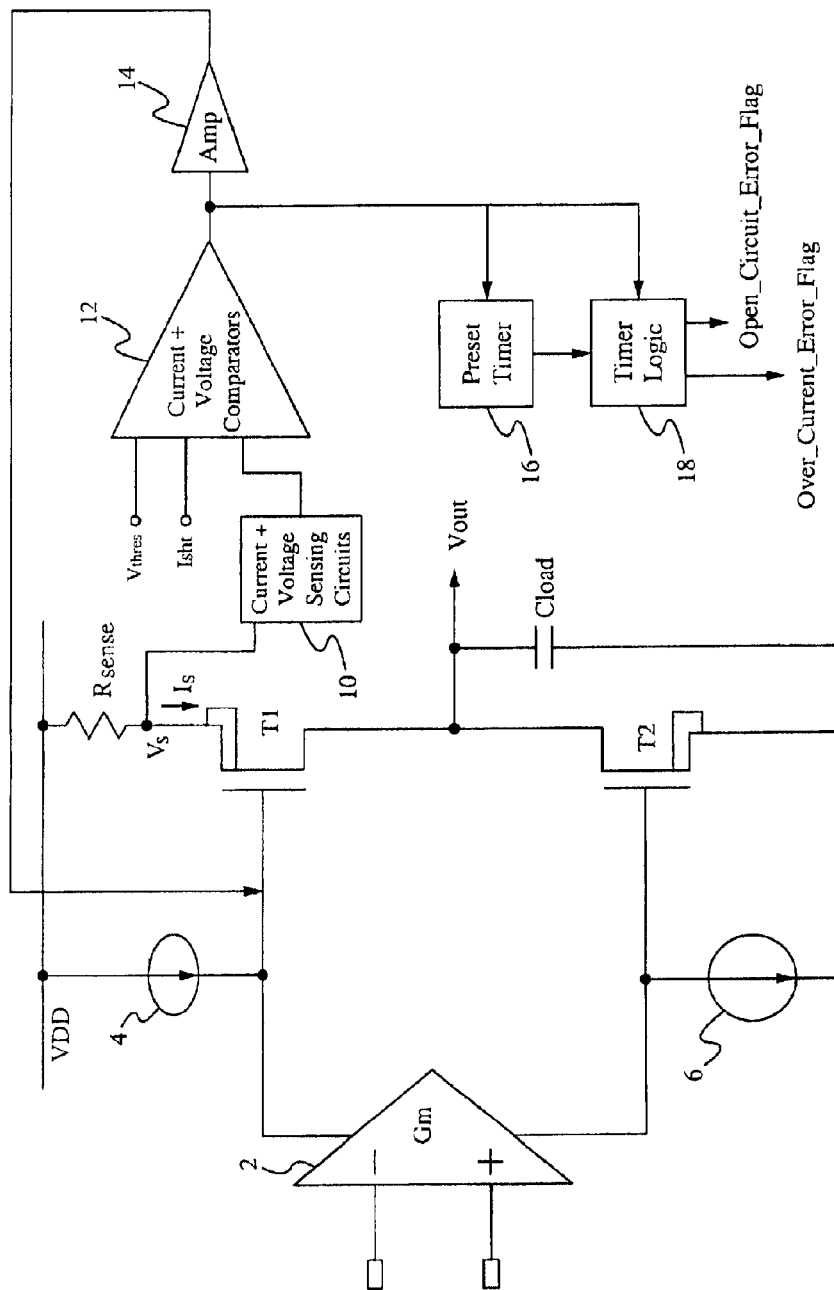
FIG. 2 illustrates a schematic diagram of another conventional driver circuit having fault detection and current limiting functionality.
Figure 3:
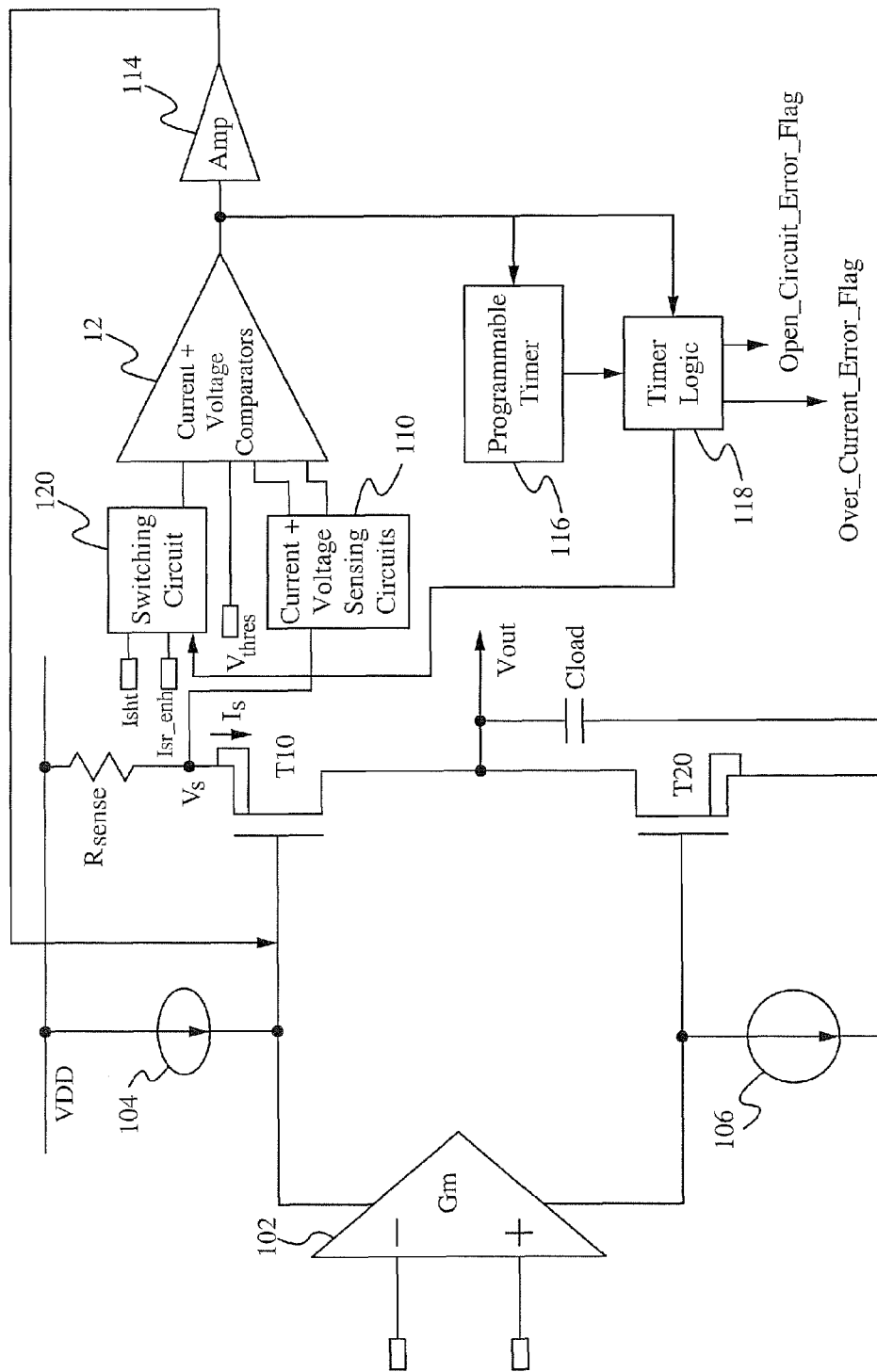
FIG. 3 illustrates a schematic diagram of a driver circuit according to an embodiment.

FIG. 3 illustrates a schematic diagram of a driver circuit according to an embodiment. The driver circuit is configured to deliver a driving signal (Vout) to a load, for example a remotely connected sensor. A differential voltage is input to a transconductance amplifier (gm amplifier) 102, which outputs a current proportional to the input voltage. The amplifier output is coupled to a driver circuit having a first transistor T10 coupled to a second transistor T20. In some embodiments, the transistor T10 and the transistor T20 are each metal-oxide-semiconductor field-effect transistors (MOSFETs). In the configuration shown in FIG. 3, the transistor T10 is a p-channel MOSFET, and the transistor T2 is a n-channel MOSFET. It is understood that other types and configurations of transistors can be used. A first output of the amplifier 102 is coupled to a gate of the first transistor T10. A second output of the amplifier 102 is coupled to a gate of the second transistor T20. A bias circuit 104 couples a supply voltage VDD to the first output of the amplifier 102 and to the gate of the transistor T10. A bias circuit 106 couples the second output of the amplifier 102 and the gate of the transistor T20 to ground. A load capacitor Cload is coupled to a drain of the transistor T10 and to a drain of the transistor T20. An output voltage Vout across the load capacitor Cload is used to drive a load. The circuit of FIG. 2 has the same input and driver stages as the circuit of FIG. 1.

A feedback circuit loop includes current and voltage sensing circuits 110, a switching circuit 120, current and voltage comparators 112, a current amplifier 114, a programmable timer 116, and a timer logic 118. The current and voltage sensing circuits 110 are configured to sense a current Is through the transistor T10 and to sense a voltage Vs at the source fo the transistor T10. In some embodiments, the current Is is determined according to the measured voltage Vs and the known value of the sense resistor Rsense. In other embodiments, the current and voltage sensing circuits 110 include a current mirror. A current mirror is a circuit designed to copy a current through one active device, such as the transistor T10, by controlling the current in another active device of a circuit, such as the current sensing circuit 110.

Conceptually, a current mirror is simply a current amplifier. In still other embodiments, a current sensing circuit other than a current mirror is used. It is understood that the current and voltage sensing circuits 110 can include any circuit that outputs the same or scaled current as the current Is through the transistor T10. The sensed current Is is input as a first input to the current and voltage comparators 112 and the sensed voltage Vs is input as a second input to the current and voltage comparators 112. FIG. 3 shows the current and voltage sensing circuits 110 as a single block. This is only conceptual and is intended to represent one or more circuits configured to measure and/or determine the sensed voltage Vs and the sensed current Is.

A third input to the current and voltage comparators 112 is the output of the switching circuit 120. The switching circuit 120 receives as input multiple different input current reference values, and outputs one of the multiple input current reference values according to a selection signal supplied by the timer logic 118. As shown in FIG. 3, two input current reference values are input to the switching circuit 120, and the switching circuit 120 selects one of the two input current reference values as output. In alternative embodiments, more than two input current reference values can be input to and selected by the switching circuit 120. A first input current reference value is a short circuit limit current Isht, which represents a normal short circuit limit current. A second input current reference value is a slew rate enhancement current Isr_enh. During the relatively short period of time that the load capacitor Cload is charging, it is desired that the current Is is higher during this time period in order to speed up the settling time. To enable the higher current Is, the input current reference value input to the comparators 112 is the slew rate enhancement current Isr_enh during the charging time period. The slew rate enhancement current Isr_enh value is greater than the short circuit limit current Isht value. Either the first input current reference value or the second input current reference value is selected by the switching circuit 120 according to a selection signal supplied by the timer logic 118.

The selected reference current is output from the switching circuit 120 and provided as the third input to the current and voltage comparators 112. The current and voltage comparators 112 determine if the sensed current has reached or exceeded the selected input current reference value. If the current and voltage comparators 112 determine that the sensed current is less than the selected reference current, then the current and voltage comparators 112 output a first signal to the current amplifier 114, the programmable timer 116, and the timer logic 118. In some embodiments, the first signal is a "low" signal, such as zero amps. The first signal indicates that an over-current condition has not been met, and that the current Is does not have to be limited. In response to the first signal, the current amplifier 114 outputs a "low" signal, such as zero amps, to the gate of the transistor T10. Also in response to the first signal, the programmable timer 116 is in an "off" state. If the current and voltage comparators 112 determine that the sensed current Is is equal to or greater than the selected input current reference value, then the current and voltage comparators 112 output a second signal to the current amplifier 114, the programmable timer 116, and the timer logic 118. In some embodiments, the second signal is a "high" signal, such as some amperage greater than zero amps. The second signal indicates that an over-current condition exists. In response to the second signal, the current amplifier 114 outputs a "high" signal to the gate of the transistor T10. This high signal at the gate limits the current Is to the selected reference current.

Also in response to the second signal, the programmable timer 116 is turned to an "on" state, which starts the clock on the programmable timer 116. The clock continues to count until the current and voltage comparators 112 determine that the sensed current has dropped below the selected input current reference value, at which time the current and voltage comparators 112 output the first signal, which turns off the programmable timer 116 and stops the count. The programmable timer 116 is set with a count threshold, which corresponds to the slew rate delay period. If the count on the programmable timer 116 reaches the count threshold, a count exceeded signal is sent from the programmable timer 116 to the timer logic 118. In response to the count exceeded signal, the timer logic 118 generates an over-current flag. If the timer count exceeds the count threshold, this indicates that the time is beyond a normal time period for slewing current charging up the load capacitor, and it is determined that there is a real problem. If a real problem is determined, the over-current flag is generated and sent by the timer logic 118. The slew rate delay period, and therefore the count threshold of the programmable timer, can be adjusted according to loading conditions. As such, the timer is programmable to provide different slew rate delay periods. In some embodiments, the programmable timer includes one or more registers to control the slew rate delay period, and the register bits can be adjusted according to the loading conditions.

The programmable timer 116 and timer logic 118 provide for a slew rate delay period before issuing an over-current flag. The slew rate delay period is used to account for a short duration event, such as charging the load capacitor Cload, which causes an increase in the current Is to the short circuit limit current for a short period of time. Although the circuit of FIG. 3 allows for such short duration events before issuing an over-current flag and adjusting the slew rate delay period allowed for the short duration events using the programmable functionality of the timer, the current Is is still limited to the short circuit limit current during this time period if only the short circuit limit current Isht is used as the input reference current.

When driving a large capacitance, the timer logic 118 sends the selection signal to the switching circuit 120 to enable a different current limit so as to boost the slewing current used to charge the load capacitor. In particular, the timer logic 118 is configured to enable the current limit to be increased from the short circuit limit current Isht to the slew rate enhancement current Isr_enh. The current limit of the current Is is increased during the slew rate delay period by selecting the slew rate enhancement current Isr_enh as the input current reference value. In some embodiments, the load capacitor Cload is monitored to determine if it is charging, and if this is the case, the timer logic selects the slew rate enhancement current.

In operation, the timer logic 118 generates the selection signal sent to the switching circuit 120 based on the output of the current and voltage comparators 112 and an instantaneous voltage Vout of the load capacitor Cload. If the instantaneous voltage Vout is less than a threshold voltage, then it is determined that the load capacitor Cload is charging or discharging, which is indicative of a short duration event that utilizes a larger current Is. If the timer logic 118 receives a "high" signal from the current and voltage comparators 112 and the instantaneous voltage Vout is less than the threshold voltage, then the timer logic 118 generates a selection signal that selects the second input current reference value corresponding to the slew rate enhancement current Isr_enh. For all other conditions, the timer logic 118 generates a selection signal that selects the first input current reference value corresponding to the short circuit limit current Isht. For example, if the timer logic 118 receives a "low" signal from the current comparator 112 and the instantaneous voltage Vout is equal to or greater than the threshold voltage, then the timer logic 118 generates a selection signal that selects the first input current reference value corresponding to the short circuit limit current Isht. This condition corresponds to normal operation and the load capacitor Cload is nearly or fully charged. As another example, if the timer logic 118 receives a "high" signal from the current and voltage comparators 112 and the instantaneous voltage Vout is equal to or greater than the threshold voltage, then the timer logic 118 generates a selection signal that selects the first input current reference value corresponding to the short circuit limit current Isht. This corresponds to a possible fault condition, as the load capacitor Cload is nearly or fully charged but the current Is is in an over-current condition. As yet another example, if the timer logic 118 receives a "low" signal from the current and voltage comparators 112 and the instantaneous voltage Vout is less than the threshold voltage, then the timer logic 118 generates a selection signal that selects the first input current reference value corresponding to the short circuit limit current Isht. This condition corresponds to a transitional period where the load capacitor Cload has been discharged but the slewing current has not yet reached the short circuit limit current. It is understood that the preceding conditions are exemplary and that other conditions can be used to determine selection of the input current reference value.

A fourth input to the current and voltage comparators 112 is an input voltage threshold value Vthres. The current and voltage comparators 112 determine if the sensed voltage Vs has reached or exceeded the input voltage threshold value Vthres. If the current and voltage comparators 112 determine that the sensed voltage Vs is less than the input voltage threshold value Vthres, then the current and voltage comparators 112 output a third signal to the programmable timer 116 and the timer logic 118. In some embodiments, the third signal is a "low" signal, such as zero amps. The third signal indicates that an over-voltage, or open circuit, condition has not been met, and an open circuit error flag does not have to be generated. In response to the third signal, the programmable timer 116 is in an "off" state. If the current and voltage comparators 112 determine that the sensed voltage Vs is equal to or greater than the input voltage threshold value Vthres, then the current and voltage comparators 112 output a fourth signal to the programmable logic 116 and the timer logic 118. In some embodiments, the fourth signal is a "high" signal, such as some amperage greater than zero amps. The fourth signal indicates that an over-voltage condition exists. In response to the fourth signal, the programmable timer 116 is turned to an "on" state, which starts the clock on the programmable timer 116. The clock continues to count until the current and voltage comparators 112 determine that the sensed voltage Vs has dropped below the input voltage threshold value Vthres, at which time the current and voltage comparators 112 output the third signal, which turns off the programmable timer 116 and stops the count. The programmable timer 116 is set with a count threshold for the over-voltage condition, which may or may not be the same as the count threshold corresponding to the over-current condition. If the count on the programmable timer 116 reaches the over-voltage count threshold, an over-voltage count exceeded signal is sent from the programmable timer 116 to the timer logic 118. In response to the over-voltage count exceeded signal, the timer logic 118 generates an open-circuit error flag.

Although shown in FIG. 3 as a single signal path between the current and voltage comparators 112 and the programmable timer 116 and the timer logic 118, in some embodiments, there is a first signal path for transmission of the first and second signals related to the short circuit condition and a second signal path for transmission of the third and fourth signals relating to the open circuit condition. Further, in the case of conflicting "on" and "off" signals, for example transmission of a first signal and a fourth signal, the "on" signal supercedes the "off" signal in regards to turning the programmable timer 116 on and off. Also, FIG. 3 shows the current and voltage comparators 112 as a single block. This is only conceptual and is intended to represent one or more circuits configured to compare the sensed voltage Vs to the voltage threshold value Vthres, and to compare the sensed current Is to the selected input current reference value.

The driver circuit provides a number of advantages. The programmable timer enables the slew rate delay period to be varied according to the loading conditions applied to the load capacitor and the chosen short circuit current limit. The timer logic enables the current limit to be increased during the slew rate delay period by selecting a larger input current reference value. Increasing the current limit provides for a faster settling time. The value of each input current reference value can be programmed. The programmable timer and the timer logic can be configured to coordinate the slew rate delay period and the selected input current reference value. The slew rate delay period can be adjusted based on which input current reference value is applied. The driver circuit is also configured to determine an open circuit condition. The programmable timer and timer logic enable the generation of an open circuit error flag to be delayed in order to account fo short duration events that may lead to false open circuit conditions.

The driver circuit has been described in terms of specific embodiments incorporating details to facilitate the understanding of the principles of construction and operation of the driver circuit. Such references, herein, to specific embodiments and details thereof are not intended to limit the scope of the claims appended hereto. It will be apparent to those skilled in the art that modifications can be made in the embodiments chosen for illustration without departing from the spirit and scope of the driver circuit.

What is claimed is:

1. A circuit comprising:
   a. an output driver circuit having a driver current;
   b. a load capacitor coupled to the driver circuit to receive the driver current; and
   c. a feedback circuit coupled to the driver circuit, wherein the feedback circuit is configured to determine an over-current condition in the driver circuit and to limit the driver current to a limit current value upon determination of the over-current condition, further wherein the feedback circuit comprises a programmable timer and a timer logic configured to delay generation of an over-current error flag in response to the over-current condition according to a slew rate delay period, the programmable timer is configured to vary the slew rate delay period according to a loading condition applied to the load capacitor.

2. The circuit of claim 1 wherein the limit current is a slewing current of the load capacitor.

3. The circuit of claim 1 wherein the feedback circuit further comprises a current comparator configured to receive the driver current as a first input and an input current reference value as a second input, the current comparator determines that the over-current condition is present if the driver current is equal to or greater than the input current reference value.

4. The circuit of claim 3 wherein the feedback circuit further comprises a current sensing circuit configured to sense the driver current through the driver circuit and to output the sensed driver current to the first input of the current comparator.

5. The circuit of claim 1 wherein the feedback circuit is further configured to determine an over-voltage condition in the driver circuit, and the programmable timer and the timer logic are further configured to delay generation of an over-voltage error flag in response to the over-voltage condition.

6. A circuit comprising:
   a. an output driver circuit having a driver current;
   b. a load capacitor coupled to the driver circuit to receive the driver current; and
   c. a feedback circuit coupled to the driver circuit, wherein the feedback circuit is configured to determine an over-current condition in the driver circuit and to limit the driver current to a limit current value upon determination of the over-current condition, further wherein the feedback circuit comprises a logic circuit configured to select one of a plurality of input current reference values received by the feedback circuit, the selected input current reference value used to determine the over-current condition and the limit current value, thereby enabling adjustment of the limit current value during the over-current condition according to the selected input current reference value.

7. The circuit of claim 6 wherein the limit current is a slewing current of the load capacitor.

8. The circuit of claim 6 wherein the limit current value is increased during the over-current condition, thereby decreasing a settling time of the circuit.

9. The circuit of claim 8 wherein the feedback circuit further comprises a programmable timer and a timer logic, wherein the programmable timer and the logic circuit are configured to delay generation of an over-current error flag in response to the over-current condition according to a slew rate delay period.

10. The circuit of claim 9 wherein the limit current is increased during the slew rate delay period by selecting a larger input current reference value from the plurality of input current reference values.

11. The circuit of claim 9 wherein the slew rate delay period is varied by the programmable timer according to a loading condition applied to the load capacitor.

12. The circuit of claim 11 wherein the selected input current reference value is determined according to the slew rate delay period.

13. The circuit of claim 9 wherein the slew rate delay period is varied by the programmable timer according to the selected input current reference value.

14. The circuit of claim 6 wherein the feedback circuit further comprises a current comparator configured to receive the driver current as a first input and the selected input current reference value as a second input, the current comparator determines that the over-current condition is present if the driver current is equal to or greater than the selected input current reference value.

15. The circuit of claim 14 wherein the feedback circuit further comprises a current sensing circuit configured to sense the driver current through the driver circuit and to output the sensed driver current to the first input of the current comparator.

16. The circuit of claim 14 wherein the feedback circuit further comprises a switching circuit configured to receive the plurality of input current reference values as a plurality of inputs, to receive a selection signal as input from the logic circuit, and to output the selected input current reference value to the second input of the current comparator.

17. The circuit of claim 6 wherein each of the plurality of input current reference values is programmable.

18. The circuit of claim 9 wherein the feedback circuit is further configured to determine an over-voltage condition in the driver circuit, and the programmable timer and the timer logic are further configured to delay generation of an over-voltage error flag in response to the over-voltage condition.

19. A circuit comprising:
   a. an output driver circuit having a driver current;
   b. a load capacitor coupled to the driver circuit to receive the driver current; and
   c. a feedback circuit coupled to the driver circuit, wherein the feedback circuit is configured to determine an over-current condition in the driver circuit and to limit the driver current to a limit current value upon determination of the over-current condition, further wherein the feedback circuit comprises:
      i. a current sensing circuit configured to sense the driver current;
      ii. a switching circuit configured to receive a plurality of input current reference values as a plurality of inputs, and to output a selected input current reference value from the plurality of input current reference values in response to a selection signal, wherein the selected input current reference value is used to determine the over-current condition and the limit current value, thereby enabling adjustment of the limit current value during the over-current condition according to the selected input current reference value;
      iii. a current comparator coupled to the current sensing circuit to receive the sensed driver current as a first input and coupled to the switching circuit to receive the selected input current reference value as a second input, the current comparator outputs a comparison signal indicating that the over-current condition is present if the driver current is equal to or greater than the selected input current reference value;
      iv. a programmable timer coupled to the current comparator; and
      v. a timer logic circuit configured to generate the selection signal and output the selection signal to the switching circuit, wherein the timer logic circuit and the programmable timer are configured to delay generation of an error flag in response to the over-current condition according to a slew rate delay period, the programmable timer is configured to vary the slew rate delay period according to a loading condition applied to the load capacitor.

20. The circuit of claim 19 wherein the limit current is a slewing current of the load capacitor.

21. The circuit of claim 19 wherein the limit current value is increased during the over-current condition, thereby decreasing a settling time of the circuit.

22. The circuit of claim 19 wherein the limit current is increased during the slew rate delay period by selecting a larger input current reference value from the plurality of input current reference values.

23. The circuit of claim 19 wherein the selected input current reference value is determined according to the slew rate delay period.

24. The circuit of claim 19 wherein each of the plurality of input current reference values is programmable.

25. The circuit of claim 19 wherein the feedback circuit is further configured to determine an over-voltage condition in the driver circuit, and the programmable timer and the timer logic are further configured to delay generation of an over-voltage error flag in response to the over-voltage condition.

* * * * *

UNITED STATES PATENT AND TRADEMARK OFFICE
CERTIFICATE OF CORRECTION

| | | |
|---|---|---|
| PATENT NO. | : 8,331,072 B1 | Page 1 of 1 |
| APPLICATION NO. | : 12/868652 | |
| DATED | : December 11, 2012 | |
| INVENTOR(S) | : Huibo Liu et al. | |

It is certified that error appears in the above-identified patent and that said Letters Patent is hereby corrected as shown below:

In the Drawings:
Sheet 1 of 3, Fig. 1                     Delete "IREF" and insert --Iref--
Sheet 3 of 3, Reference
Numeral 12, Fig. 3                     Delete "12" and insert --112--

In the Specifications:
Column 8, Line 17                     After "to", delete "the"
Column 8, Line 40                     Delete "T2" and insert --T20--
Column 8, Line 52                     Delete "FIG. 2" and insert --FIG. 3--
Column 8, Line 60                     Delete "fo" and insert --of--
Column 12, Line 30                    Delete "fo" and insert --for--

Signed and Sealed this
Thirty-first Day of December, 2013

Margaret A. Focarino
*Commissioner for Patents of the United States Patent and Trademark Office*